US011035922B2

(12) United States Patent
Nitta et al.

(10) Patent No.: US 11,035,922 B2
(45) Date of Patent: Jun. 15, 2021

(54) MAGNETIC RESONANCE IMAGING APPARATUS AND MAGNETIC RESONANCE IMAGING METHOD FOR CORRECTING DISTORTION OF A COLLECTED MAGNETIC RESONANCE IMAGE

(71) Applicant: Canon Medical Systems Corporation, Otawara (JP)

(72) Inventors: Shuhei Nitta, Tokyo (JP); Naho Imamura, Nasushiobara (JP); Takahiro Ohmure, Otawara (JP); Hiroshi Takai, Nasushiobara (JP); Nobuyasu Ichinose, Otawara (JP); Yoshimori Kassai, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 1 day.

(21) Appl. No.: 16/533,080

(22) Filed: Aug. 6, 2019

(65) Prior Publication Data

US 2020/0041600 A1 Feb. 6, 2020

(30) Foreign Application Priority Data

Aug. 6, 2018 (JP) .............................. JP2018-147786

(51) Int. Cl.
 *G01R 33/565* (2006.01)
 *G01R 33/561* (2006.01)
 *G01R 33/421* (2006.01)
 *G01R 33/56* (2006.01)
 *G01R 33/563* (2006.01)

(52) U.S. Cl.
 CPC ...... *G01R 33/56563* (2013.01); *G01R 33/421* (2013.01); *G01R 33/5608* (2013.01); *G01R 33/5616* (2013.01); *G01R 33/56341* (2013.01)

(58) Field of Classification Search
 CPC .......... G01R 33/56563; G01R 33/5616; G01R 33/421; G01R 33/5608; G01R 33/56341; G01R 33/4835; G01R 33/3875; G01R 33/543
 See application file for complete search history.

(56) References Cited

U.S. PATENT DOCUMENTS

2007/0280520 A1* 12/2007 Takai ................. G01R 33/5616
 382/131

FOREIGN PATENT DOCUMENTS

JP 2011087758 A * 5/2011
JP 4812420 B2 11/2011

* cited by examiner

*Primary Examiner* — Susan S Lee
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry calculates a static magnetic field correction amount based on a static magnetic field distribution of a first imaging range narrower than a second imaging range. The processing circuitry collects a magnetic resonance (MR) image of the second imaging range under a static magnetic field which is corrected based on the static magnetic field correction amount. The processing circuitry corrects distortion of the collected MR image.

14 Claims, 8 Drawing Sheets

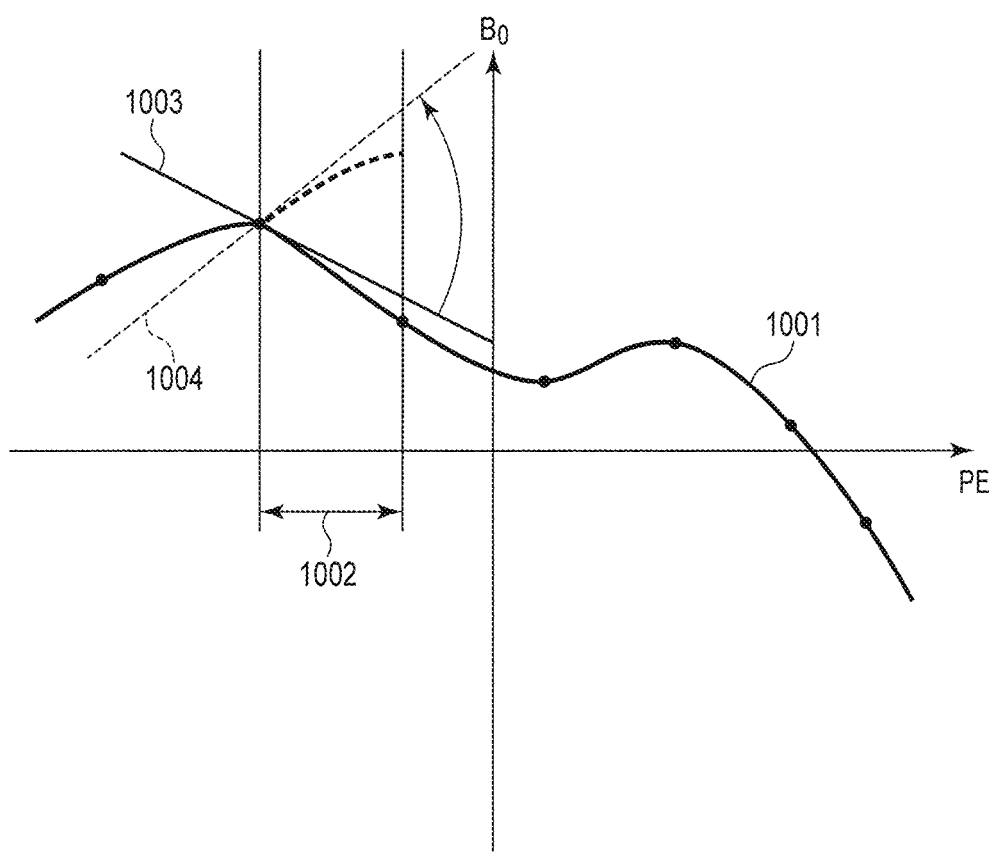
F I G. 10

MAGNETIC RESONANCE IMAGING APPARATUS AND MAGNETIC RESONANCE IMAGING METHOD FOR CORRECTING DISTORTION OF A COLLECTED MAGNETIC RESONANCE IMAGE

CROSS-REFERENCE TO RELATED APPLICATIONS

This application is based upon and claims the benefit of priority from the prior Japanese Patent Application No. 2018-147786, filed Aug. 6, 2018, the entire contents of which are incorporated herein by reference.

FIELD

Embodiments described herein relate generally to a magnetic resonance imaging apparatus and a magnetic resonance imaging method.

BACKGROUND

A technique relating to a magnetic resonance imaging (MRI) apparatus that performs shimming on a static magnetic field based on a static magnetic field distribution (hereinafter, referred to as "static magnetic field shimming"), is known. For example, an MRI apparatus optimizes a center frequency of a prepulse, and a center frequency of an RF pulse for each slice, by performing static magnetic field shimming during multi-slice imaging.

However, it is extremely difficult to obtain complete homogeneity in a static magnetic field through static magnetic field shimming, and in a case of using the EPI (echo planar imaging) sequence, distortions may occur in an MR image due to inhomogeneity of a static magnetic field, etc. Types of such distortions include extension and contraction of pixels in an MR image. If pixels are contracted, image quality of the MR image (spatial resolution) is degraded.

BRIEF DESCRIPTION OF THE DRAWINGS

FIG. 10 is a conceptual drawing of a method of calculating a static magnetic field correction amount and a method of correcting a static magnetic field.

DETAILED DESCRIPTION

In general, according to one embodiment, a magnetic resonance imaging apparatus includes processing circuitry. The processing circuitry calculates a static magnetic field correction amount based on a static magnetic field distribution of a first imaging range narrower than a second imaging range. The processing circuitry collects a magnetic resonance (MR) image of the second imaging range under a static magnetic field which is corrected based on the static magnetic field correction amount. The processing circuitry corrects distortion of the collected MR image.

A magnetic resonance imaging (MRI) apparatus and a magnetic resonance imaging method according to the present embodiment will be described with reference to the accompanying drawings. In the embodiments described below, elements assigned with the same reference symbols perform the same operations, and redundant descriptions thereof will be omitted as appropriate.

Figure 1:
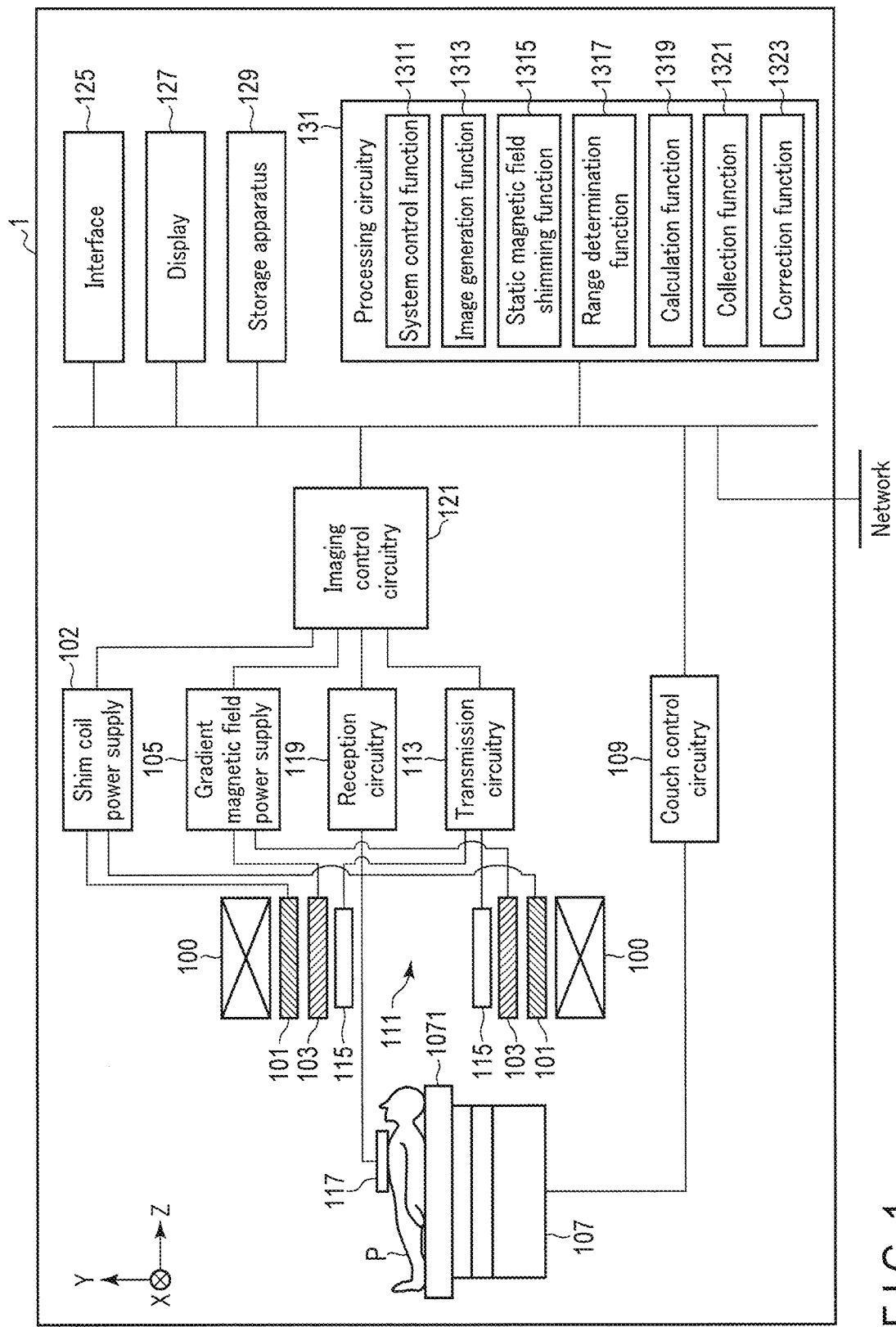
FIG. 1 is a diagram showing a configuration of a magnetic resonance imaging apparatus according to an embodiment.

FIG. 1 is a diagram showing a configuration of the magnetic resonance imaging (MRI) apparatus 1 in the present embodiment. As shown in FIG. 1, the MRI apparatus 1 includes a static magnetic field magnet 100, a shim coil 101, a shim coil power supply 102, a gradient coil 103, a gradient magnetic field power supply 105, a couch 107, couch control circuitry 109, transmission circuitry 113, a transmitter coil 115, a receiver coil 117, reception circuitry 119, imaging control circuitry 121, an interface 125, a display 127, a storage apparatus 129, and processing circuitry 131. The couch control circuitry 109, the imaging control circuitry 121, the interface 125, the display 127, the storage apparatus 129, and the processing circuitry 131 are connected wirelessly or with wires for data transmission. A subject P is not included in the MRI apparatus 1.

The static magnetic field magnet 100 is a magnet formed in a hollow, approximately cylindrical shape. The static magnetic field magnet 100 generates an approximately uniform static magnetic field in the inner space. For example, a superconducting magnet or the like is used as the static magnetic field magnet 100. As shown in FIG. 1, the Z-axis direction is defined as the same as the orientation of the static magnetic field. In addition, the Y-axis direction is a vertical direction, and the X-axis direction is a direction perpendicular to each of the Z-axis and the Y-axis.

The shim coil 101 generates a correction magnetic field that corrects second-order or higher components of inhomogeneity of a static magnetic field generated by the static magnetic field magnet 100. The shim coil 101 is joined to an outer surface of the gradient coil 103 via a not-shown insulation layer. Generally, inhomogeneity of a static magnetic field is expressed by components, such as a 0-order component, first-order components $X^1$, $Y^1$, $Z^1$, and second-order components $X^2$, $Y^2$, $Z^2$, XY, YZ, ZX. There may be third-order or higher components in inhomogeneity of a static magnetic field. A multiple-order component is a second-order or higher component.

To simplify the description hereinafter, let us suppose a high-order component is a second-order component. In this case, the shim coil 101 has a second-order shim structure. In addition, the shim coil 101 has, for example, five coil patterns each corresponding to second-order components of inhomogeneity of a static magnetic field, ZX, XY, YZ, $(Z^2-(X^2+Y^2)/2)$, and $(X^2-Y^2)$. The five coil patterns of the shim coil 101 respectively generate a five-channel correction magnetic field for correcting the second-order components of inhomogeneity of the static magnetic field, ZX, XY, YZ, $(Z^2-(X^2+Y^2)/2)$, and $(X^2-Y^2)$, in accordance with a current supplied from the shim coil power supply 102. When static magnetic field shimming is performed in consideration of the multiple-order components of inhomogeneity of the static magnetic field, the shim coil 101 has coil patterns in accordance with the multiple-order components. The static magnetic field shimming relating to the present embodiment will be described later.

The shim coil power supply 102 is a power supply apparatus that supplies a current to the shim coil 101 under the control of the imaging control circuitry 121. Specifically, the shim coil power supply 102 independently supplies a current to each of the five coil patterns in the shim coil 101. In other words, the shim coil power supply 102 supplies a current corresponding to a second-order shimming value determined by the static magnetic field shimming in the present embodiment to each of the five coil patterns in the shim coil 101.

The gradient coil 103 is a coil formed in a hollow, approximately cylindrical shape. The gradient coil 103 is arranged inside the shim coil 101. The gradient coil 103 is formed by combining three coils respectively corresponding to the X-, Y-, and Z-axes which are orthogonal to each other. These three coils in the gradient coil 103 are separately supplied with a current from the gradient magnetic field power supply 105, and respectively generate gradient magnetic fields in which magnetic field intensity changes along each of the X-, Y-, and Z-axes.

The gradient magnetic fields along each of the X-, Y-, and Z-axes generated by the gradient coil 103 respectively form, for example, a gradient magnetic field for frequency encoding (readout gradient field), a gradient magnetic field for phase encoding, and a gradient magnetic field for slice selection. The gradient magnetic field for slice selection is used to determine an imaging slice at will. The gradient magnetic field for phase encoding is used to change the phase of an MR signal in accordance with the spatial position. The gradient magnetic field for frequency encoding is used to change the frequency of an MR signal in accordance with the spatial position. In addition, the gradient magnetic fields of the X-, Y-, and Z-axes generated by the gradient coil 103 are used as offset of first-order shimming of a static magnetic field.

The gradient magnetic field power supply 105 is a power supply apparatus that supplies a current to the gradient coil 103 under the control of the imaging control circuitry 121. Specifically, the gradient coil corresponding to the X-axis generates, by the supply of a current from the gradient magnetic field power supply 105, a correction magnetic field having approximately the same magnetic field direction as the $X^1$ component of inhomogeneity of a magnetic static magnetic field, and a gradient magnetic field for frequency encoding. The gradient coil corresponding to the Y-axis generates, by the supply of a current from the gradient magnetic field power supply 105, a correction magnetic field having approximately the same magnetic field direction as the $Y^1$ component of inhomogeneity of a static magnetic field, and a gradient magnetic field for phase encoding. The gradient coil corresponding to the Z-axis generates, by the supply of a current from the gradient magnetic field power supply 105, a correction magnetic field having approximately the same magnetic field direction as the $Z^1$ component of inhomogeneity of a static magnetic field, and a gradient magnetic field for slice selection. In other words, three gradient magnetic field coils respectively corresponding to the X-, Y-, and Z-axes are used to correct first-order components of inhomogeneity of a static magnetic field, in addition to generation of a gradient magnetic field relating to imaging.

The couch 107 is an apparatus having a couch top 1071 on which a subject P is laid. The couch 107 inserts the couch top 1071 on which the subject P is laid into the bore 111 under the control of the couch control circuitry 109. The couch 107 is installed in, for example, an examination room in such a manner that the longitudinal axis of the couch 107 is parallel to the central axis of the static magnetic field magnet 100.

The couch control circuitry 109 is circuitry that controls the couch 107. The couch control circuitry 109 drives the couch 107 in accordance with an operator's instruction via the interface 125 to move the couch top 1071 in a longitudinal direction and a vertical direction.

The transmission circuitry 113 supplies a high-frequency pulse modulated by a Larmor frequency to the transmitter coil 115 under the control of the imaging control circuitry 121.

The transmitter coil 115 is an RF coil provided inside the gradient coil 103. The transmitter coil 115 generates an RF pulse corresponding to a radio frequency magnetic field in accordance with an output from the transmission circuitry 113. The transmitter coil 115 is, for example, a whole-body coil (WB coil) including a plurality of coil elements. The WB coil may be used as a transmitter/receiver coil. The transmitter coil 115 may also be a WB coil made of a single coil.

The receiver coil 117 is an RF coil provided inside the gradient coil 103. The receiver coil 117 receives MR signals that are emitted from the subject P, caused by a radio frequency magnetic field. The receiver coil 117 outputs the received MR signals to the reception circuitry 119. The receiver coil 117 is a coil array including, for example, one or more, typically, a plurality of coil elements. In FIG. 1, the transmitter coil 115 and the receiver coil 117 are illustrated as separate RF coils; however, the transmitter coil 115 and the receiver coil 117 may be realized by an integrated transmitter/receiver coil. The transmission/receiver coil is, for example, a local transmission/reception RF coil, such as a head coil, to serve an imaging target in the subject P.

The reception circuitry 119 generates a digital MR signal (hereinafter referred to as "MR data") based on the MR signal that is output from the receiver coil 117 under the control of the imaging control circuitry 121. Specifically, the reception circuitry 119 performs various types of signal processing to the MR signal that is output from the receiver coil 117, and then performs analog-to-digital (A/D) conversion of data to which the variety of signal processing is performed. The reception circuitry 119 samples the A/D-converted data. The reception circuitry 119 thereby generates MR data. The reception circuitry 119 outputs the generated MR data to the imaging control circuitry 121.

The imaging control circuitry 121 controls, for example, the shim coil power supply 102, the gradient magnetic field power supply 105, the transmission circuitry 113, and the reception circuitry 119 in accordance with an imaging protocol that is output from the processing circuitry 131, and performs imaging on the subject P. An imaging protocol has different pulse sequences in accordance with a body part targeted for imaging and a type of examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and pulse width of the high frequency pulse supplied from the transmission circuitry 113 to the transmitter coil 115, timing of the supply of the high frequency pulse from the transmission circuitry 113 to the transmitter coil 115, and timing of reception of the MR signal at the receiver coil 117, etc.

The interface 125 is realized by, in order to receive various instructions and information inputs from an operator, a switch button, a mouse, a keyboard, a touch pad with which an input operation can be performed by touching its operation screen, a touch screen in which a display screen and a touch pad are integrated, and non-contact input circuitry using an optical sensor, or sound input circuitry, etc. The interface 125, which is connected to the processing circuitry 131, etc., converts outputs an input operation received from the operator into an electric signal, and outputs the signal to the processing circuitry 131. In the present specification, the interface is not limited to physical operation components such as a mouse and a keyboard. For example, the interface 125 also includes electrical signal processing circuitry that receives an electrical signal corresponding to an input operation through an external input device provided independently from the apparatus, and outputs the electrical signal to the system control circuitry.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field.

The storage apparatus 129 stores, for example, MR data filled in the k-space with the use of the image generation function 1313, image data generated by the image generation function 1313, imaging protocols, imaging conditions including the imaging parameters defining the imaging protocols, and the like. The storage apparatus 129 stores programs corresponding to various functions executed by the processing circuitry 131. The storage apparatus 129 stores a program for calculating a 0-order shimming value, first-order shimming values, and second-order shimming values based on static magnetic field shimming in the present embodiment (hereinafter, a calculation program).

The 0-order shimming value corresponds to a resonance frequency of water in each of the slices in a collection region of multi-slice collection. In other words, the 0-order shimming value relates to correction of the 0-order components of inhomogeneity of the static magnetic field in each of the slices in the collection region. The first-order shimming values correspond to values of currents respectively supplied to the three gradient coils from the gradient magnetic power supply 105 so as to correct the $X^1$, $Y^1$, and $Z^1$ components of inhomogeneity of the static magnetic field in each of the slices relating to the multi-slice collection. In other words, the 1-order shimming value relates to correction of the 1-order components of inhomogeneity of the static magnetic field in each of the slices in the collection region. The second-order shimming values correspond to values of currents respectively supplied to the five coil patterns in the shim coil 101 from the shim coil power supply 102 so as to correct the ZX, XY, YZ, $(Z^2-(X^2+Y^2)/2)$, $(X^2-Y^2)$ components of inhomogeneity of the static magnetic field in the entire collection region of the multi-slice collection. In other words, the second-order shimming value relates to correction of the second-order components of inhomogeneity of the static magnetic field in the entire collection region.

The storage apparatus 129 is, for example, a semiconductor memory element, such as a RAM (Random Access Memory) and a flash memory, a hard disk drive, a solid state drive, or an optical disk, etc. The storage apparatus 129 may also be, for example, a drive that performs reading and writing various kinds of information on a portable storage medium such as a CD-ROM drive, a DVD drive, or a flash memory.

The processing circuitry 131 includes, as hardware resources, a processor and a memory such as a ROM and a RAM, which are not shown, and controls the present MRI apparatus 1. The processing circuitry 131 includes a system control function 1311, an image generation function 1313, a static magnetic field shimming function 1315, a range determination function 1317, a calculation function 1319, a collection function 1321, and a correction function 1323. The various types of functions executed by the system control function 1311, the image generation function 1313, the static magnetic field shimming function 1315, the range determination function 1317, the calculation function 1319, the collection function 1321, and the correction function 1323, are stored in the storage apparatus 129 in a form of a computer-executable program. In this case, the processing circuitry 131 may be a processor which reads a program corresponding to each of those functions from the storage apparatus 129 and executes the program to realize the function corresponding to the program.

FIG. 1 illustrates the case where the various functions are realized in a single processor; however, the processing circuitry 131 may be constituted by a combination of a plurality of independent processors, and the functions may be realized by the processors executing the programs. In other words, each of the above-mentioned functions may be configured as a program, and executed by a single processing circuit; alternatively, a specific function may be implemented in a dedicated independent program-execution circuit. Although FIG. 1 illustrates the single storage apparatus 129 storing a program corresponding to each processing function, a plurality of storage apparatuses may be provided and the processing circuitry 131 may be configured to read a corresponding program from each storage apparatus.

The term "processor" used in the above description means, for example, a central processing unit (CPU), a graphics processing unit (GPU), circuitry such as an application specific integrated circuit (ASIC), or a programmable logic device (e.g., a simple programmable logic device (SPLD), a complex programmable logic device (CPLD), or a field programmable gate array (FPGA)).

The processor realizes various functions by reading and executing programs stored in the storage apparatus 129. A program may be directly integrated into the circuitry of the processor, instead of storing the program on the storage apparatus 129. In this case, the function is realized by reading and executing the program integrated into the circuitry. Similarly, each of the couch control circuitry 109, the transmission circuitry 113, the reception circuitry 119, and the imaging control circuitry 121, etc. are constituted by an electronic circuit, such as the above-described processor.

The processing circuitry 131 controls the MRI apparatus 1 by the system control function 1311. Specifically, the processing circuitry 131 reads the system control program stored in the storage apparatus 129, loads it in the memory, and controls each circuitry and each power supply of the present MRI apparatus 1 in accordance with the loaded system control program. For example, the processing circuitry 131 reads an imaging protocol from the storage apparatus 129 based on imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P.

By executing the image generation function 1313, the processing circuitry 131 fills MR data along a readout direction of k-space in accordance with, for example, an intensity of the readout gradient magnetic field. The processing circuitry 131 generates an MR image by executing an inverse Fourier transform to the MR data filled in k-space. The processing circuitry 131 outputs the generated MR image to the display 127 and the storage apparatus 129.

The above is the general description of the overall configuration of the MRI apparatus 1 according to the present embodiment.

Figure 2:
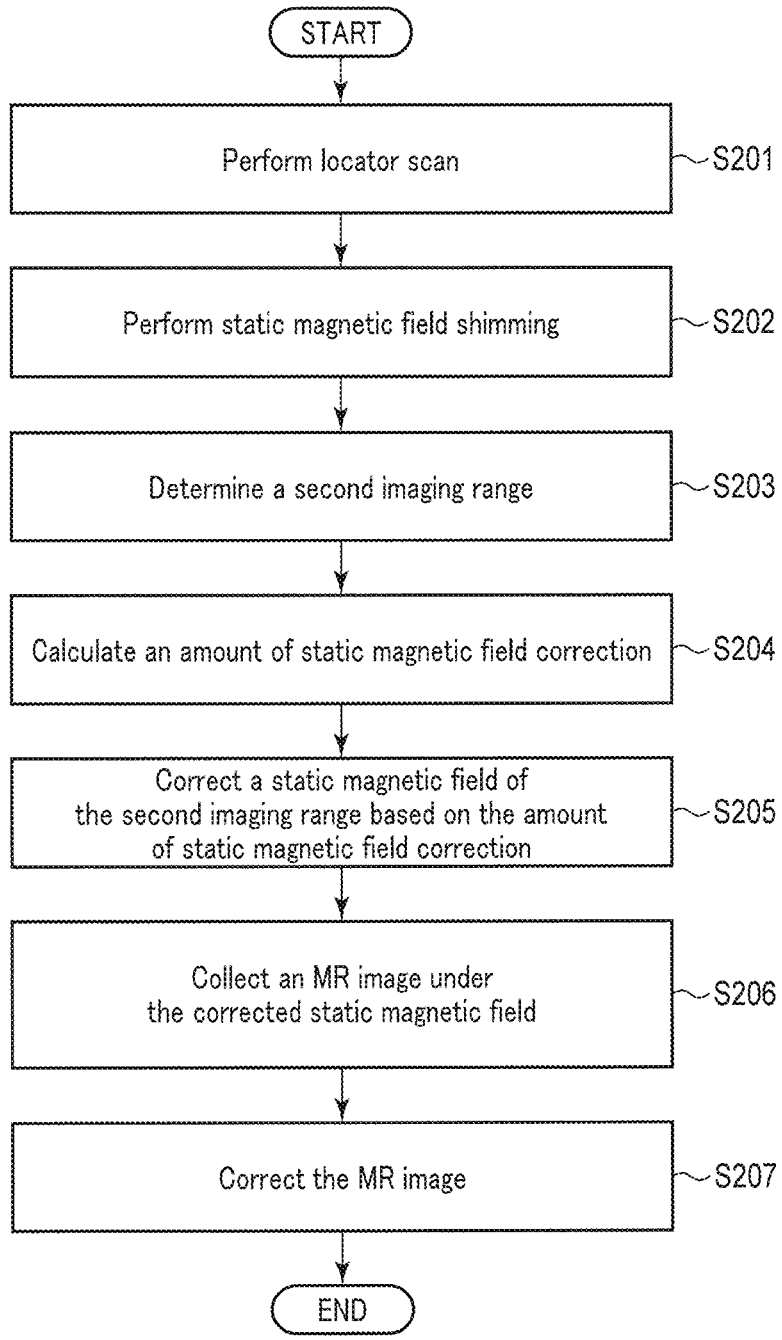
FIG. 2 is a flow chart showing an example of an operation of the magnetic resonance imaging apparatus according to the embodiment.

Next, the operation of the MRI apparatus 1 according to the present embodiment will be described with reference to the flow chart of FIG. 2.

In the present embodiment, let us suppose that a collected MR Image is a diffusion-weighted image (DWI) collected by the echo planar imaging (EPI) sequence.

In step S201, a locator scan is performed. Specifically, the imaging control circuitry 121 performs a locator scan in accordance with an instruction from the processing circuitry 131, for example. The locater scan determines a second imaging range of a diagnosis image of a subject (for example, a field of view (FOV)). The processing circuitry 131 generates a locator image for the second imaging range by using an MR signal collected by the locator scan. The processing circuitry 131 may output the generated locator image to the display 127.

In step S202, by executing the static magnetic field shimming function 1315, the processing circuitry 131 performs static magnetic field shimming. The details of the static magnetic field shimming will be described later.

In step S203, by executing the range determination function 1317, the processing circuitry 131 determines a first imaging range, which is narrower than the second imaging range. The first imaging range is a region of interest (ROI) in the diagnosis image, for example. The first imaging range may be determined through designation via a user's input, for example a range designated by a user via the display 127. The first imaging range may be either automatically determined in accordance with an examination target part of a subject, or by default, thereby a predetermined range around a magnetic field center or an image center is determined as a first imaging range. The first imaging range may be determined based on a result of learning through artificial intelligence (AI).

In step S204, by executing the calculation function 1319, the processing circuitry 131 calculates an amount of static magnetic field correction from a static magnetic field distribution which includes at least the first imaging range. Specifically, by executing the calculation function 1319, an amount of static magnetic field correction that makes a first-order differential of the static magnetic field intensity in the first imaging range positive, is calculated. In other words, an amount of static magnetic field correction is calculated so that distortion occurring in an MR image taken under a static magnetic field corrected in accordance with the amount takes the form of extension of pixels.

In step S205, by executing the system control function 1311 for example, the processing circuitry 131 adjusts, the static magnetic field in the first imaging range based on the calculated amount of static magnetic field correction. As a result of the adjustment of the static magnetic field based on the amount of static magnetic field correction, image distortion in which pixels are extended can be obtained.

The adjustment based on the amount of static magnetic field correction may be achieved when, for example, by executing the system control function 1311, the processing circuitry 131 applies a current to the system coil 101 in accordance with the amount of static magnetic field correction.

In step S206, by executing the collection function 1321, the processing circuitry 131 collects an MR image of the second imaging range under the static magnetic field corrected based on the amount of static magnetic field correction.

In step S207, by executing the correction function 1323, the processing circuitry 131 corrects the MR image. The correction of the MR image is achieved by the processing circuitry 131 through execution of the image generation function 1313 for example, in such a manner that image distortion in which pixels of the MR image are extended is corrected by a distortion correction process. For example, the processing circuitry 131 calculates a shift amount of each pixel in the MR image. The processing circuitry 131 calculates a correction amount regarding distortion correction in accordance with the calculated shift amount, and corrects the image distortion by applying the calculated correction amount to each pixel. The amount of extension of pixels corresponds to the shift amount based on a frequency offset from the center frequency (to be later described). Any common image processing method can be adopted for distortion correction, and detailed description of the correction process is omitted. This concludes the operation of the MRI apparatus 1 according to the present embodiment.

Next, the details of the static magnetic field shimming performed in step S202 of the present embodiment will be described.

The imaging control circuitry 121 performs shimming imaging to a subject P. The imaging control circuitry 121 performs shimming imaging by, for example, multi-slice imaging adopting a double-echo method in which two different echo time intervals are used. The shimming imaging may be performed by other imaging methods, such as a multi-slice imaging method adopting a triple-echo method in which three different echo time intervals are used. Shimming imaging is performed to a three-dimensional first region, which is formed by a slice corresponding to a plurality of cross sections in the region of the locator image. Specifically, the imaging control circuitry 121 controls the gradient magnetic power supply 105, the transmission circuitry 113, and the reception circuitry 119, in accordance with the double-echo method. The imaging control circuitry 121 collects MR signals corresponding to two echo time intervals via the receiver coil 117 and the reception circuitry 119 by shimming imaging.

The processing circuitry 131 generates, by executing the static magnetic field shimming function 1315, a plurality of static magnetic field distributions respectively corresponding to a plurality of slices in the second region, based on the MR signals collected by the shimming imaging. Specifically, the processing circuitry 131 generates two complex images respectively corresponding to the two echo time intervals, based on the MR signals of the slices in the second region. The processing circuitry 131 performs complex conjugate calculation to one of the two complex images, and calculates a product of the complex image to which complex conjugate calculation has been performed and the other complex image to which complex conjugate calculation has not been performed. The processing circuitry 131 generates a phase difference image by using a phase of the calculated product.

The processing circuitry 131 generates, by executing the static magnetic field shimming function 1315, an intensity image by using at least one of the two complex images. The processing circuitry 131 extracts a background region in the phase difference image based on the intensity image. The processing circuitry 131 removes the background from the phase difference image by using the extracted background region. The processing circuitry 131 performs a phase unwrap process in consideration of continuity of phase to the phase difference image from which the background has been removed. The processing circuitry 131 performs linear conversion to a value of the phase difference in each pixel in the phase difference image to which the phase unwrap processing has been performed, by using an echo interval corresponding to a difference of the two echo time intervals and a gyromagnetic ratio, thereby generating a two-dimensional static magnetic field distribution as frequency information. The processing circuitry 131 generates a three-dimensional static magnetic field distribution (hereinafter, "pre-shimming distribution") by coupling multiple two-dimensional static magnetic field distributions. The pre-shimming distribution may be stored in the storage apparatus 129 as default setting, in accordance with a body part targeted for imaging, sex, age, and so on. In this case, the shimming imaging is unnecessary.

The processing circuitry 131 performs, by executing the static magnetic field shimming function 1315, per-slice static magnetic field shimming to each of the slices respectively corresponding to the positions of the cross sections in the first region, by using the positions of the cross sections in the first region and the pre-shimming distribution. Specifically, the processing circuitry 131 reads, by executing the static magnetic field shimming function 1315, a calculation program from the storage apparatus 129, and develops it in own memory. The processing circuitry 131 calculates 0-order, first-order, and second-order shimming values for each of the slices in the first region with the use of the calculation program. The processing circuitry 131 associates the calculated 0-order, first-order, and second-order shimming values with a slice corresponding to the position of the displayed cross section. A basic expression of the static magnetic field shimming will be described below, and the per-slice static magnetic field shimming will be then be described.

An example of basic expression relating to the static magnetic field shimming is shown in FIG. 1 below.

$$b'_0(x,y,z) = a_0 + a_1 x + a_2 y + a_3 z + b_0(x,y,z) \quad (1)$$

In the expression (1), x, y, and z are variables to represent three-dimensional positions in a space. Specifically, the variable x represents a position with respect to a center of the static magnetic field in the horizontal direction (X-axis) (hereinafter "magnetic field center"), which is defined as an origin. The variable y represents a position with respect to the magnetic field center in the vertical direction (Y-axis) as an origin. The variable z represents a position with respect to the magnetic field center in the axial direction (Z-axis) as an origin. Herein, a unit of each of x, y, z is [m]. $a_0$ in the expression (1) is a 0-order shimming value. $a_0$ represents a value to which a minus sign is put to a center frequency of an RF pulse. A unit of $a_0$ is [ppm]. $a_1$, $a_2$, and $a_3$ in the expression (1) are first-order shimming values.

Specifically, $a_1$, $a_2$, and $a_3$ represent an amount of change in a resonance frequency per unit length for each of the X-, Y-, and Z-axes, respectively. An amount of change in a resonance frequency per unit length corresponds to a gradient of the gradient magnetic field, in other words, a value of current applied to the gradient coil 103. A unit of $a_1$, $a_2$, $a_3$ is [ppm/m]. $b_0(x,y,z)$ in the expression (1) is a resonance frequency in the position (x,y,z) before the static magnetic field shimming is performed. In other words, $b_0(x,y,z)$ is a result of converting a three-dimensional static magnetic field distribution corresponding to the aforementioned pre-shimming distribution into a resonance frequency, that is a distribution of resonance frequency representing inhomogeneity of a static magnetic field. A unit of $b_0(x,y,z)$ is [ppm]. $b_0'(x,y,z)$ is a difference value representing a difference between a resonance frequency in the position (x,y,z) after shimming and a center frequency of an RF pulse. A unit of $b_0'(x,y,z)$ is [ppm].

The left side of the expression (1), namely the difference value regarding the resonance frequency after shimming and the center frequency of the RF pulse becomes a desirable condition for static magnetic field shimming, if the value is smaller. If a set of all positions of a plurality of pixels in a foreground region (hereinafter, foreground pixels) corresponding to a non-foreground region (hereinafter, a position set S) is considered for an image representing the pre-shimming distribution, the position set S can expressed by the expression (2) below:

$$S \in \{(x_i, y_i, z_i)^T\}, i=1,2,\ldots,N \quad (2)$$

In the expression (2), i represents a serial number of a foreground pixel. N represents a total number of the foreground pixels.

At this time, N expressions (1) can be held for all the foreground pixels in the image of the pre-shimming distribution. If the N expressions (1) for all the foreground pixels are combined, the expression (3) below can be obtained:

$$\begin{pmatrix} b'_0(x_1,y_1,z_1) \\ \vdots \\ b'_0(x_N,y_N,z_N) \end{pmatrix} = \begin{pmatrix} 1 & x_1 & y_1 & z_1 \\ \vdots & \vdots & \vdots & \vdots \\ 1 & x_N & y_N & z_N \end{pmatrix} \begin{pmatrix} a_0 \\ a_1 \\ a_2 \\ a_3 \end{pmatrix} + \begin{pmatrix} b_0(x_1,y_1,z_1) \\ \vdots \\ b_0(x_N,y_N,z_N) \end{pmatrix} \quad (3)$$

In the expression (3), if a vector b', a matrix X, a vector a, and a vector b are defined as follows:

$$b' = \begin{pmatrix} b'_0(x_1,y_1,z_1) \\ \vdots \\ b'_0(x_N,y_N,z_N) \end{pmatrix}, X = \begin{pmatrix} 1 & x_1 & y_1 & z_1 \\ \vdots & \vdots & \vdots & \vdots \\ 1 & x_N & y_N & z_N \end{pmatrix},$$

$$a = \begin{pmatrix} a_0 \\ a_1 \\ a_2 \\ a_3 \end{pmatrix}, b = \begin{pmatrix} b_0(x_1,y_1,z_1) \\ \vdots \\ b_0(x_N,y_N,z_N) \end{pmatrix}$$

The expression (3) can then be expressed as shown in the expression (4) below:

$$b' = Xa + b \quad (4)$$

As aforementioned, the smaller each element of the vectors in the left side of the expression (1), namely, the left side of the expression (3) or (4), is, the more ideal it becomes for the static magnetic field shimming. Accordingly, homogeneity of the static magnetic field is defined as an amplitude of the vector b', and the cost function E regarding the vector a, which is obtained by combining 0-order shimming values and first-order shimming values, is defined as the expression (5).

$$E(a) = (Xa+b)^T \Omega^{-1} (Xa+b) \quad (5)$$

The matrix $\Omega$ in the expression (5) is a matrix for normalization in accordance with the importance of each element in the vector b' and correlation between the elements. For example, if the matrix $\Omega$ is a unitary matrix, the cost function is simply a sum of squares of a vector element. If the matrix $\Omega$ is a covariance matrix relating to the vector b', the cost function is a square of Mahalanobis' distance. The vector a, which is a combination of the 0-order shimming value and first-order shimming values, that minimizes the cost function (5) can be determined by the expression (6) shown below with the use of a least-squares method.

$$\hat{a} = \mathrm{argmin}_a E(a) \quad (6)$$

The per-slice static magnetic field shimming will be described below. Let us suppose a set of positions, $S_j$, of a plurality of foreground pixels per slice in the first region for the first region (in which per-slice static magnetic field shimming is performed), the position set $S_j$ can be expressed by the expression (7) below, for example:

$$S_j \in \{(x_i, y_i, z_i)^T\}, j = 1, 2, \ldots, M, i = 1, 2, \ldots, N_j \quad (7)$$

In the expression (7), j represents a serial number of the slices of the first region. M in the expression (7) represents the number of slices in the first region. i in the expression (7) represents a serial number of a foreground pixel. $N_j$ represents the total number of the foreground pixels in a slice j.

In the per-slice static magnetic field shimming, $N_j$ expressions (1) can be established for all the foreground pixels $N_j$ for each slice j in the first region. In the slice j, a vector $b_j'$, a matrix $X_j$, a vector $a_j$, and a vector $b_j$ are defined as follows:

$$b_j' = \begin{pmatrix} b_0'(x_1, y_1, z_1) \\ \vdots \\ b_0'(x_{N_j}, y_{N_j}, z_{N_j}) \end{pmatrix}, X_j = \begin{pmatrix} 1 & x_1 & y_1 & z_1 \\ \vdots & \vdots & \vdots & \vdots \\ 1 & x_{N_j} & y_{N_j} & z_{N_j} \end{pmatrix},$$

$$a_j = \begin{pmatrix} a_0(j) \\ a_1(j) \\ a_2(j) \\ a_3(j) \end{pmatrix}, b_j = \begin{pmatrix} b_0(x_1, y_1, z_1) \\ \vdots \\ b_0(x_{N_j}, y_{N_j}, z_{N_j}) \end{pmatrix}$$

The vector $b_j$ corresponds to the entire foreground pixels in the static magnetic field distribution corresponding to the slice j, among the plurality of static magnetic field distributions related to the aforementioned pre-shimming distribution. In the slice j, if the $N_j$ expressions (1) for all the foreground pixels are combined, the expression (8) below can be obtained:

$$b_j' = X_j a_j + b_j \quad (8)$$

For the expression (8), the processing circuitry 131 defines a cost function similarly to the expression (5) by the static magnetic field shimming function 1315. Thus, M patterns of the vector $a_j$, which is a combination of the 0-order shimming and first-order shimming values, can be calculated. In other words, by performing shimming using a value of $a_j$ for each slice j of the multiple slices, examination image collection by per-slice static magnetic field shimming can be realized.

Next, a basic expression relating to the second-order shimming using a shim coil capable of applying a two-dimensional correction magnetic field distribution in terms of space is shown as the expression (9) below:

$$b_0'(x, y, z) = a_0 + a_1 x + a_2 y + a_3 z + a_4 zx + a_5 xy + \quad (9)$$

$$a_6 yz + a_7 \left( z^2 - \frac{x^2 + y^2}{2} \right) + a_8 (x^2 - y^2) + b_0(x, y, z)$$

The elements x, y, z, $a_0$, $a_1$, $a_2$, $a_3$, $b_0$, $b_0'$ in the expression (9) are defined similarly to those in the expression (1). $a_4$, $a_5$, $a_6$, $a_7$, and $a_8$ are second-order shimming values. Specifically, each of $a_4$, $a_5$, $a_6$, $a_7$, and $a_8$ represents an amount of change in a spatially non-linear resonance frequency. An amount of change in a spatially non-linear resonance frequency corresponds to a value of a current applied to the shim coil 101. A unit of $a_4$, $a_5$, $a_6$, $a_7$, and $a_8$ is [ppm/m$^2$].

In this case, N expressions (9) can be established for all the foreground pixels within the three-dimensional static magnetic field distribution image, and they can be combined as the expression (10) shown below:

$$(10)$$

$$\begin{pmatrix} b_0'(x_1, y_1, z_1) \\ \vdots \\ b_0'(x_N, y_N, z_N) \end{pmatrix} =$$

$$\begin{pmatrix} 1 & x_1 & y_1 & z_1 & z_1 x_1 & x_1 y_1 & y_1 z_1 & z_1^2 - \frac{x_1^2 + y_1^2}{2} & x_1^2 - y_1^2 \\ \vdots & \vdots & \vdots & \vdots & \vdots & \vdots & \vdots & \vdots & \vdots \\ 1 & x_N & y_N & z_N & z_N x_N & x_N y_N & y_N z_N & z_N^2 - \frac{x_N^2 + y_N^2}{2} & x_N^2 - y_N^2 \end{pmatrix}$$

$$\begin{pmatrix} a_0 \\ a_1 \\ a_2 \\ a_3 \\ a_4 \\ a_5 \\ a_6 \\ a_7 \\ a_8 \end{pmatrix} + \begin{pmatrix} b_0(x_1, y_1, z_1) \\ \vdots \\ b_0(x_N, y_N, z_N) \end{pmatrix}$$

In the expression (10), a vector b', a vector a, a vector b, a matrix X, a matrix X', and a matrix X" are defined as follows:

$$b' = \begin{pmatrix} b'_0(x_1, y_1, z_1) \\ \vdots \\ b'_0(x_N, y_N, z_N) \end{pmatrix}, a' = \begin{pmatrix} a_0 \\ a_1 \\ a_2 \\ a_3 \\ a_4 \\ a_5 \\ a_6 \\ a_7 \\ a_8 \end{pmatrix}, b = \begin{pmatrix} b_0(x_1, y_1, z_1) \\ \vdots \\ b_0(x_N, y_N, z_N) \end{pmatrix},$$

$$X = \begin{pmatrix} 1 & x_1 & y_1 & z_1 \\ \vdots & \vdots & \vdots & \vdots \\ 1 & x_N & y_N & z_N \end{pmatrix},$$

$$X' = \begin{pmatrix} z_1 x_1 & x_1 y_1 & y_1 z_1 & z_1^2 - \frac{x_1^2 + y_1^2}{2} & x_1^2 - y_1^2 \\ \vdots & \vdots & \vdots & \vdots & \vdots \\ z_N x_N & x_N y_N & y_N z_N & z_N^2 - \frac{x_N^2 + y_N^2}{2} & x_N^2 - y_N^2 \end{pmatrix}, X'' = (X \quad X')$$

The expression (10) can then be expressed as shown in the expression (11) below:

$$b' = X''a' + b \quad (11)$$

Since the expression (11) has the same form as the expression (4) except for the matrix X" and the size of the vector a', the vector a', which is a combination of the 0-order, first-order, and second-order shimming values can be determined in a manner similar to the case of solving the expressions (5) and (6).

The static magnetic field shimming in the present embodiment using the above-described 0-order, first-order, and second-order shimming values is formulated. Unlike the 0-order and first-order shimming, it takes more time for the magnetic field to become stable in the second-order shimming after a current is applied to the shim coil 101; accordingly, it is difficult to rapidly switch the correction magnetic field per slice when multi-slice collection is performed. Thus, an object of the static magnetic field shimming in the present embodiment is to calculate an appropriate amount of correction per slice for the 0-order shimming and first-order shimming on the assumption that the second-order shimming is performed for all the slices in the collection region. To summarize the above, a basic expression of the static magnetic field shimming in the present embodiment can be expressed as the expression (12) below:

$$b' = X'''a'' + b \quad (12)$$

In the expression (12), if a vector b', a matrix X''', a vector a", and a vector b are defined as follows:

$$b' = \begin{pmatrix} b'_1 \\ \vdots \\ b'_M \end{pmatrix}, X''' = \begin{pmatrix} X_1 & 0 & 0 & X' \\ 0 & \ddots & 0 & X' \\ 0 & 0 & X_M & X' \end{pmatrix}, a'' = \begin{pmatrix} a_1 \\ \vdots \\ a_M \\ a_3 \\ a_4 \\ a_5 \\ a_6 \\ a_7 \\ a_8 \end{pmatrix}, b = \begin{pmatrix} b_1 \\ \vdots \\ b_M \end{pmatrix}$$

The expression (12) has the same form as the expression (4). For this reason, the processing circuitry 131 can calculate, by the static magnetic field shimming function 1315, the vector a", which is a combination of the 0-order and first-order shimming values of each slice in the collection region and the second-order shimming values of the entire collection region, in a manner similar to the case of solving the expressions (5) and (6). Specifically, the processing circuitry 131 defines a cost function similarly to the expression (5). The processing circuitry 131 calculates the vector a", which is a combination of the 0-order, first-order, and second-order shimming values, by the least-squares method with which the cost function relating to the expression (12) is minimized.

Next, a concept of calculation of the amount of static magnetic field correction according to the present embodiment will be described.

Figure 3:
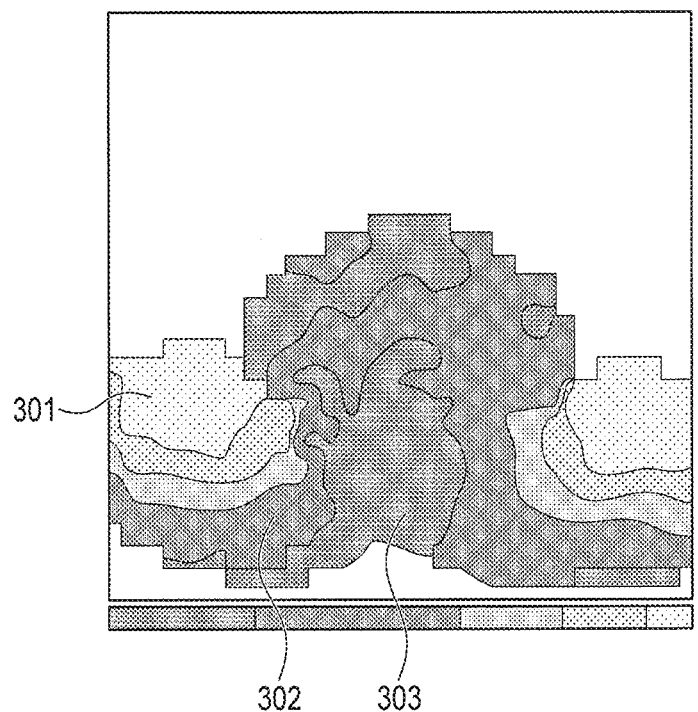
FIG. 3 is a diagram showing an example of an estimated static magnetic field distribution after per-slice shimming according to the embodiment.

FIG. 3 shows an example of an estimated static magnetic field distribution after per-slice shimming, wherein the static magnetic field intensity is converted into a corresponding frequency distribution. The vertical direction of the image shown in FIG. 3 is a phase encoding direction, and the horizontal direction is a frequency encoding direction. The frequency distribution of the region 302 corresponds to the center frequency. In this case, the frequency of the region 301 is higher than the center frequency. In contrast, the frequency of the region 303 is lower than the center frequency.

Next, an example of a shift amount vector image of pixels calculated from the estimated static magnetic field distribution shown in FIG. 3 will be described with reference to FIG. 4.

Figure 4:
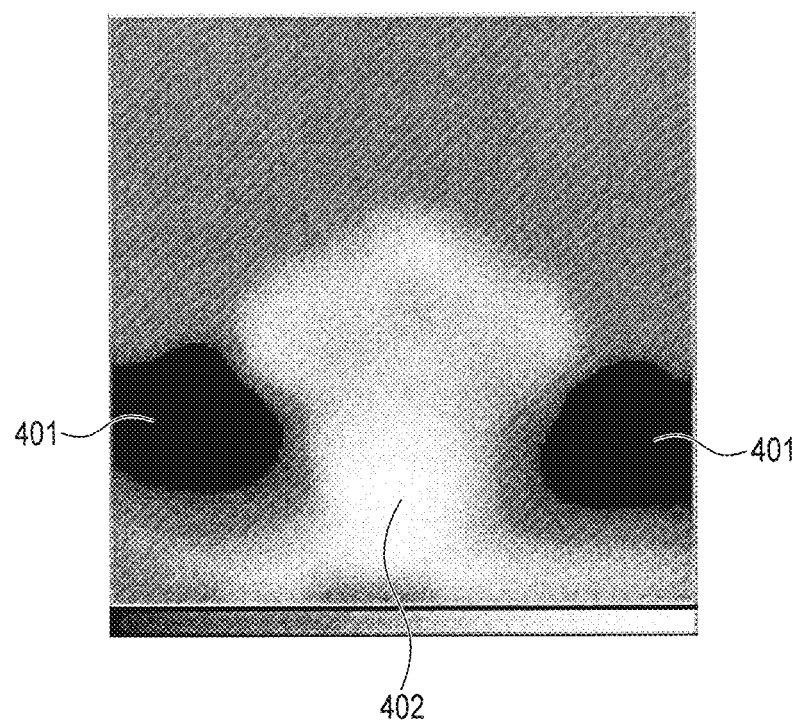
FIG. 4 is a diagram showing an example of a shift amount vector image of each pixel calculated from the estimated static magnetic field distribution shown in FIG. 3.

FIG. 4 shows the shift amounts based on frequency offsets from the center frequency in accordance with the estimated static magnetic field distribution shown in FIG. 3. The shift amount (pixel) is calculated by the expression (13) shown below at each pixel position in the estimated static magnetic field distribution. By executing the system control function 1311, the processing circuitry 131 may cause the display 127 to display the shift amounts of the pixel positions in the MR image.

Shift amount [pixel]=(frequency offset [Hz])×(ETS (Echo Train Spacing) [sec])×(collection phase encoding number [steps])  (13)

The frequency offset can be calculated by the following expression: Frequency offset=(center frequency)−(frequency of pixel position)

As shown in FIG. 4, the region 401 corresponds to the region 301 in FIG. 3, and has a frequency higher than the center frequency. In the region 401, if the MR image is taken by the EPI sequence, it is predicted that the pixels of the MR image will be extended in the phase encoding direction. On the other hand, the region 402 corresponds to the region 303 in FIG. 3, and has a frequency lower than the center frequency. In the region 402, it is predicted that the pixels of the MR image will be contracted.

In image processing, if pixels are contracted, pixel values thereof are summed; as a result, it is difficult to estimate original pixel values. To give a simple example, if two pixels having a pixel value of "10" are contracted and the pixel values are summed, they become a single pixel having a pixel value of "20". If the contracted pixel is restored into two pixels, the pixel values may be estimated as "5" and "15", which are not the original values. On the other hand, if the pixels are extended, a pixel value of one pixel is divided into two or more pixel values; accordingly, an original pixel value can be estimated by summing the two or more pixel values.

Accordingly, a static magnetic field correction amount can be calculated based on the shift amounts shown in FIG. 4, in such a way that at least the region 402, having a negative shift amount, is not present in the first imaging range; in other words, pixels are not contracted. For example, a current value applied to the shim coil may be adjusted so that the shift amount is of a positive value.

Next, a first example of the display of shift amounts is described with reference to FIG. 5.

Figure 5:
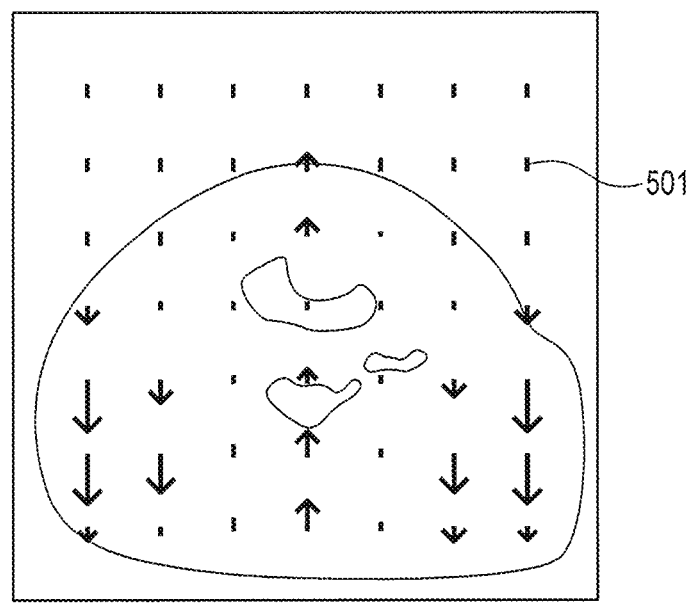
FIG. 5 is a diagram showing an example in which a shift amount is displayed in the form of a vector on a diffusion-weighted image (DWI).

FIG. 5 shows an example where the shift amounts are superimposed in the form of vectors on the DWI obtained by the EPI sequence under the estimated static magnetic field distribution shown in FIG. 3. Each vector 501 shown in a bold line indicates a magnitude and a direction of a shift amount at each pixel position. In other words, the vectors 501 superimposed on the region 301 are directed downwardly with respect to the image. Similarly, the vectors 501 superimposed on the region 303 are directed upwardly with respect to the image.

Herein, the detection of image distortions based on the shift amounts is described with reference to FIGS. 6A through 6C and FIGS. 7A through 7C.

In the EPI sequence, artifacts are remarkably present in the phase encoding direction. For this reason, the processing circuitry 131 compares the shift amounts between the coordinates (between pixel positions) in the phase encoding direction through execution of the calculation function 1319, and thereby detects contraction or extension of the pixels of the MR image.

Figure 6A:
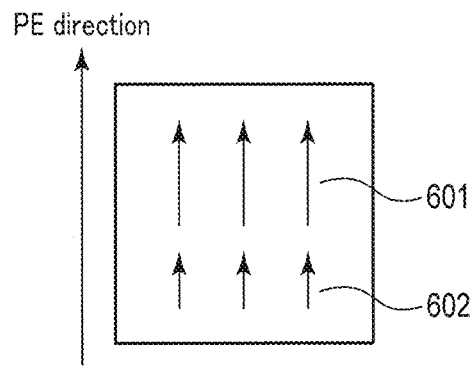
FIG. 6A is a conceptual drawing showing a relationship of shift amounts in a case where image distortion takes the form of extension.
Figure 6B:
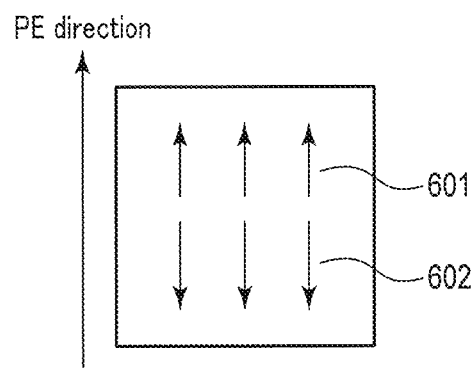
FIG. 6B is a conceptual drawing showing a relationship of shift amounts in a case where image distortion takes the form of extension.
Figure 6C:
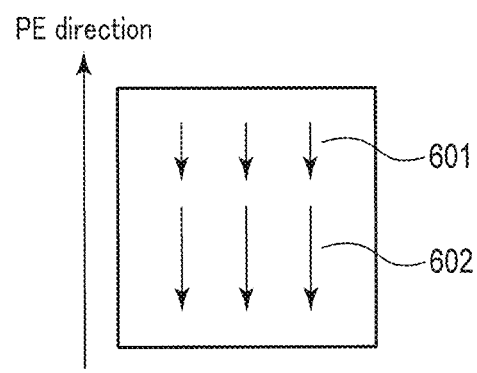
FIG. 6C is a conceptual drawing showing a relationship of shift amounts in a case where image distortion takes the form of extension.

FIGS. 6A through 6C are conceptual drawings showing the relationships of shift amounts in a case where image distortion takes the form of extension. The vectors 601 and 602 indicate shift amounts in adjacent pixel positions, similarly to FIG. 5.

In FIG. 6A, the vectors 601 and 602 are in the same direction along the phase encoding direction (PE direction), but the vector 601 is longer than the vector 602, and the shift amount of the vector 601 is larger than that of the vector 602. Thus, extension of the image occurs in the image region corresponding to the pixel position between the vector 601 and the vector 602.

In FIG. 6B, the vectors 601 and 602 are in the same longitude in the PE direction, but the vector 601 is in the PE direction, and the vector 602 is in a direction opposite to the PE direction. Thus, extension of the image occurs in the image region corresponding to the pixel position between the vector 601 and the vector 602.

In FIG. 6C, the vectors 601 and 602 are in opposite directions along the PE direction, but the vector 602 is longer than the vector 601, and the shift amount of the vector 602 is larger than that of the vector 601. Thus, extension of the image occurs in the image region corresponding to the pixel position between the vector 601 and the vector 602.

Figure 7A:
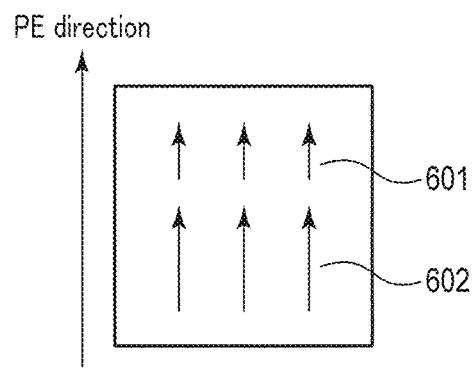
FIG. 7A is a conceptual drawing showing a relationship of shift amounts in a case where image distortion takes the form of contraction.
Figure 7B:
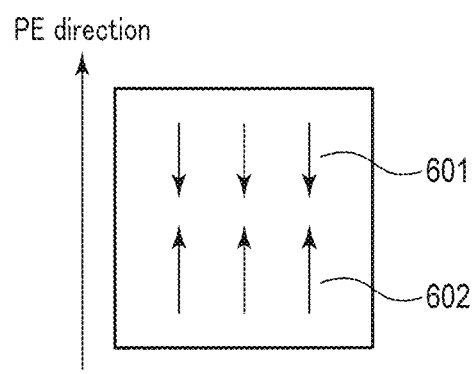
FIG. 7B is a conceptual drawing showing a relationship of shift amounts in a case where image distortion takes the form of contraction.
Figure 7C:
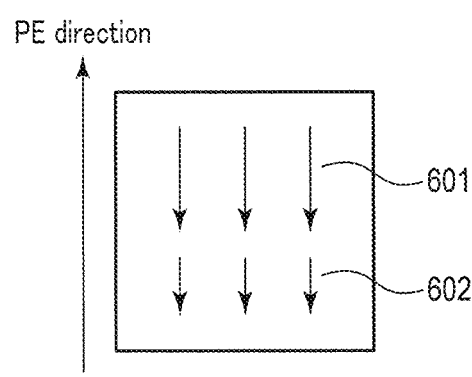
FIG. 7C is a conceptual drawing showing a relationship of shift amounts in a case where image distortion takes the form of contraction.

FIGS. 7A through 7C are conceptual drawings showing the relationships of shift amounts in a case where image distortion takes the form of contraction.

In FIG. 7A, the vectors 601 and 602 are in the same direction along the PE direction, but the vector 602 is longer than the vector 602, and the shift amount of the vector 601 is larger than that of the vector 601. Thus, contraction of the image occurs in the image region corresponding to the pixel position between the vector 601 and the vector 602.

In FIG. 7B, the vectors 601 and 602 are in the same longitude in the PE direction, but the vector 601 is in a direction opposite to the PE direction and the vector 602 is in the PE direction. Thus, contraction of the image occurs in the image region corresponding to the pixel positions of the vector 601 and the vector 602.

In FIG. 7C, the vectors 601 and 602 are in opposite directions along the PE direction, but the vector 601 is longer than the vector 602, and the shift amount of the vector 601 is larger than that of the vector 602. Thus, contraction of the image occurs in the image region corresponding to the pixel position between the vector 601 and the vector 602.

A second example of the display of shift amounts is described with reference to FIG. 8.

Figure 8:
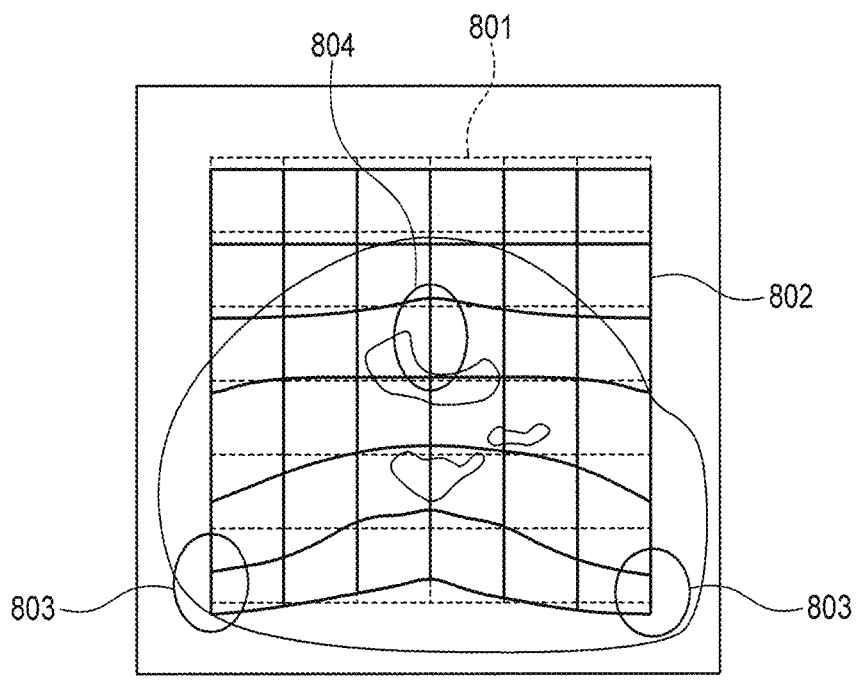
FIG. 8 is a drawing showing an example of a grid display of shift amounts on a DWI.

FIG. 8 shows an example of shift amounts superimposed on a DWI in a grid display. The grid 801 having dashed lines indicating pixel positions in the case where no distortions occur, and the shift-amount grid 802 having solid lines indicating pixel positions in the case where distortions occur, are shown.

If the lattice points of the grid 801 are compared with those of the shift-amount grid 802, the lattice points included in the region 803 in the bottom right and left in the shift-amount grid 802 are shifted downwardly with respect to the image. In other words, in the region 803, the intervals of the lattice points in the shift-amount grid 802 are narrower than those in the grid 801, and the pixels are therefore contracted and the MR image is distorted.

On the other hand, the lattice points included in the region 804 in the center part of the shift-amount grid 802 are shifted upwardly with respect to the image. In other words, in the region 804, the intervals of the lattice points in the shift-amount grid 802 are wider than those in the grid 801, and the pixels are extended and the MR image is distorted. Thus, it is desirable that the shift amounts in the first imaging region are those shown in the region 804.

Through the display of the shift amounts in a grid, a region in which pixels of the MR image are extended or contracted can be visualized. It is thereby possible for a user to easily recognize a direction of distortions in the image.

Next, an example of an intensity distribution based on shift amounts is described with reference to FIG. 9.

Figure 9:
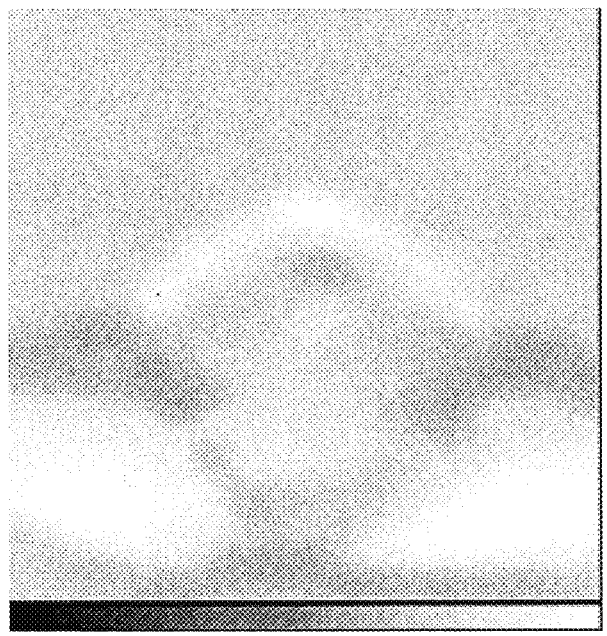
FIG. 9 is a drawing showing a normalized intensity distribution based on the shift amounts.

FIG. 9 shows a normalized intensity distribution based on the shift amounts. Comparing to FIG. 3, the pixels in the region where the shift amounts are large are contracted, and brightness values thereof are high in the image.

Next, a concept of calculation of a static magnetic field correction amount and correction of a static magnetic field is described with reference to FIG. 10.

FIG. 10 shows a curve (graph) 1001 representing the changes in the magnetic field intensity at the pixel positions in the phase encoding direction at a certain frequency encoding position. The horizontal axis indicates the phase encoding direction, and the vertical axis indicates the magnetic field intensity.

Herein, let us suppose that the first imaging range 1002 in the PE direction is determined. In the first imaging range 1002, the first-order differential 1003 of the graph 1001 is in the state where the gradient slopes down from left to right, in other words, in the state shown in FIG. 7A in terms of the relationship of the shift amounts. In other words, the state where the image is contracted is shown.

Thus, if a magnetic field intensity is set in such a manner that the gradient of the first-order differential 1003 becomes positive, and slopes up from left to right, the image is not distorted or extended. In the example shown in FIG. 10, by executing the calculation function 1319, the processing circuitry 131 calculates a static magnetic field intensity of the first imaging range as a static magnetic field correction amount, in such a manner that the first-order differential 1003 slopes up from left to right, as in the case of the dashed line 1004. For example, by executing the static magnetic field shimming function 1315, the processing circuitry 131 sets a current value to be applied to the shim coil 101 in accordance with the static magnetic field correction amount. It is thereby possible to intentionally extend the pixels of a collected MR image in at least the first imaging range.

In the foregoing embodiment, through the correction of a static magnetic field distribution at least in the first imaging range so as to extend the pixels therein, the type of image distortions observed in an MR image taken under the corrected static magnetic field distribution takes the form of extension of pixels. Image processing can be easily performed to remove the extension of pixels in the MR image in the first imaging range, and thereby creates an MR image having no distortions; therefore, it is possible to correct an MR image as appropriate. Image quality of an MR image can thus be improved. In other words, extension of pixels is intentionally acted upon the first imaging range to ensure good image quality, as the first imaging range is clinically important. This is because extension of pixels can be more reliably corrected than contraction of pixels.

In the present embodiment, second-order or higher components are considered in terms of inhomogeneity of a static magnetic field; however, if intensity of a static magnetic field is small (for example, 1.5 [T]), 0-order component and first-order components are corrected but higher-order components need not be corrected. In this case, the MRI apparatus 1 need not include a shim coil 101 and a shim coil power supply 102.

Furthermore, the functions described in connection with the above embodiments may be implemented, for example, by installing a program for executing the processing in a computer, such as a workstation, etc., and expanding said program in a memory. The program that causes the computer to execute the processing can be stored and distributed by means of a storage medium, such as a magnetic disk (a hard disk, etc.), an optical disk (CD-ROM, DVD, Blu-ray (registered trademark) etc.), and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured to:
   calculate a static magnetic field correction amount based on a static magnetic field distribution of a first imaging range narrower than a second imaging range;
   collect a magnetic resonance (MR) image of the second imaging range under a static magnetic field which is corrected based on the static magnetic field correction amount; and
   correct distortion of the collected MR image.

2. The apparatus according to claim 1, wherein the processing circuitry calculates the static magnetic field correction amount so that a first-order differential of a static magnetic field intensity of the first imaging range becomes positive.

3. The apparatus according to claim 1, wherein the processing circuitry calculates the static magnetic field correction amount so that the distortion of the MR image takes the form of extension of pixels.

4. The apparatus according to claim 1, wherein the processing circuitry is further configured to display a shift amount of a pixel position of the MR image.

5. The apparatus according to claim 4, wherein the processing circuitry displays the shift amount in the form of a vector.

6. The apparatus according to claim 4, wherein the processing circuitry displays the shift amount in the form of a grid.

7. The apparatus according to claim 1, wherein the MR image is a diffusion-weighted image taken with the use of an echo planar imaging sequence.

8. A magnetic resonance imaging method comprising:
   calculating a static magnetic field correction amount based on a static magnetic field distribution of a first imaging range narrower than a second imaging range;
   collecting a magnetic resonance (MR) image of the second imaging range under a static magnetic field which is corrected based on the static magnetic field correction amount; and
   correcting distortion of the collected MR image.

9. The method according to claim 8, wherein the static magnetic field correction amount is calculated so that a first-order differential of a static magnetic field intensity of the first imaging range becomes positive.

10. The method according to claim 8, wherein the static magnetic field correction amount is calculated so that the distortion of the MR image takes the form of extension of pixels.

11. The method according to claim 8, further comprising displaying a shift amount of a pixel position of the MR image.

12. The method according to claim 11, wherein the shift amount is displayed in the form of a vector.

13. The method according to claim 11, wherein the shift amount is displayed in the form of a grid.

14. The method according to claim 8, wherein the MR image is a diffusion-weighted image taken with the use of an echo planar imaging sequence.

* * * * *